United States Patent [19]

Atsumi et al.

[11] Patent Number: 4,970,691
[45] Date of Patent: Nov. 13, 1990

[54] 2-CELL/1-BIT TYPE EPROM

[75] Inventors: Shigeru Atsumi; Sumio Tanaka, both of Tokyo; Junichi Miyamoto, Yokohama, all of Japan

[73] Assignee: Kabushiki Kaisha Toshiba, Kawasaki, Japan

[21] Appl. No.: 334,842

[22] Filed: Apr. 7, 1989

[30] Foreign Application Priority Data

Apr. 13, 1988 [JP] Japan .................................. 63-91073

[51] Int. Cl.$^5$ ............................................ G11C 11/40
[52] U.S. Cl. ............................... 365/189.11; 365/208; 365/230.08; 365/104
[58] Field of Search .................... 365/230.03, 207, 208, 365/230.08, 189.05, 189.11, 190, 189.06, 104, 185; 307/530

[56] References Cited

U.S. PATENT DOCUMENTS 4,543,500  9/1985  McAlexander, III ..... 365/189.11 X
4,601,017  7/1986  Mochizuki et al. ............ 365/189.11

OTHER PUBLICATIONS

"A 25ns 16K CMOS PROM Using a 4-Transistor Cell", Saroj Pathak, et al, 1985, IEEE Int'l Solid-State Circuits Conference, Digest of Technical Papers, pp. 162-163.

Primary Examiner—Joseph A. Popek
Attorney, Agent, or Firm—Finnegan, Henderson, Farabow, Garrett, and Dunner

[57] ABSTRACT

The first input terminal of a differential amplification type sense amplifier is connected to a first memory cell array and the second input terminal thereof is connected to a second memory cell array. Each of the first and second memory cell arrays is formed of a plurality of memory cells arranged in a matrix form. Each of the memory cells in the first memory cell array and a corresponding one of the memory cells in the second memory cell array are provided in the form of pair for each bit. Complementary data is programmed into the paired memory cells according to programming data. In the data readout operation, the potential of data read out from the paired memory cells is amplified by means of the differential amplification type sense amplifier. First and second loads are connected to the first and second input terminals of the differential amplification type sense amplifier. The mutual conductances of the first and second loads are controlled so as to set the potential difference between the potentials of data read out from the paired memory cells selected in the first and second memory cell arrays smaller in the verify mode than in the normal readout mode.

17 Claims, 8 Drawing Sheets

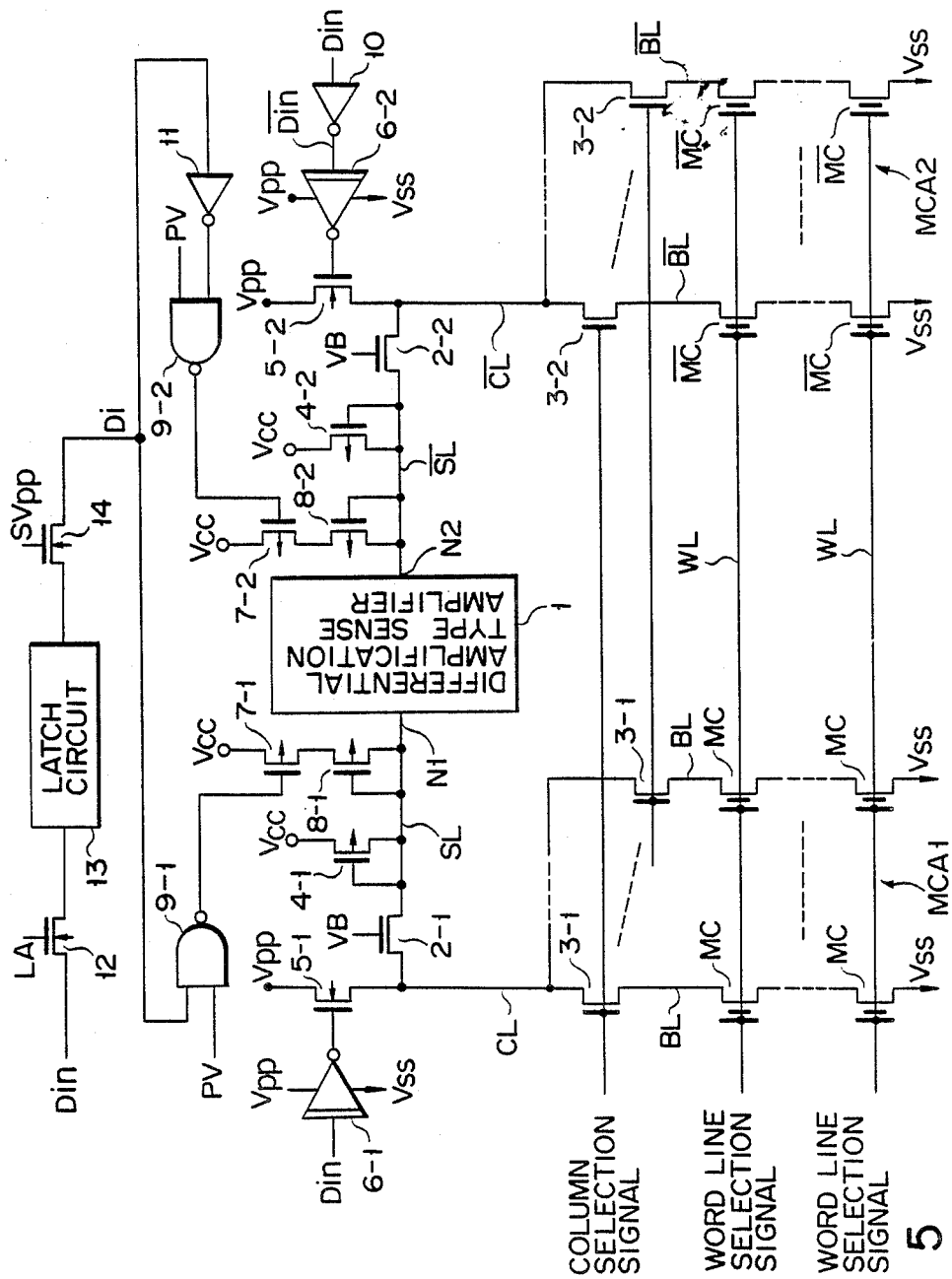
F I G. 5

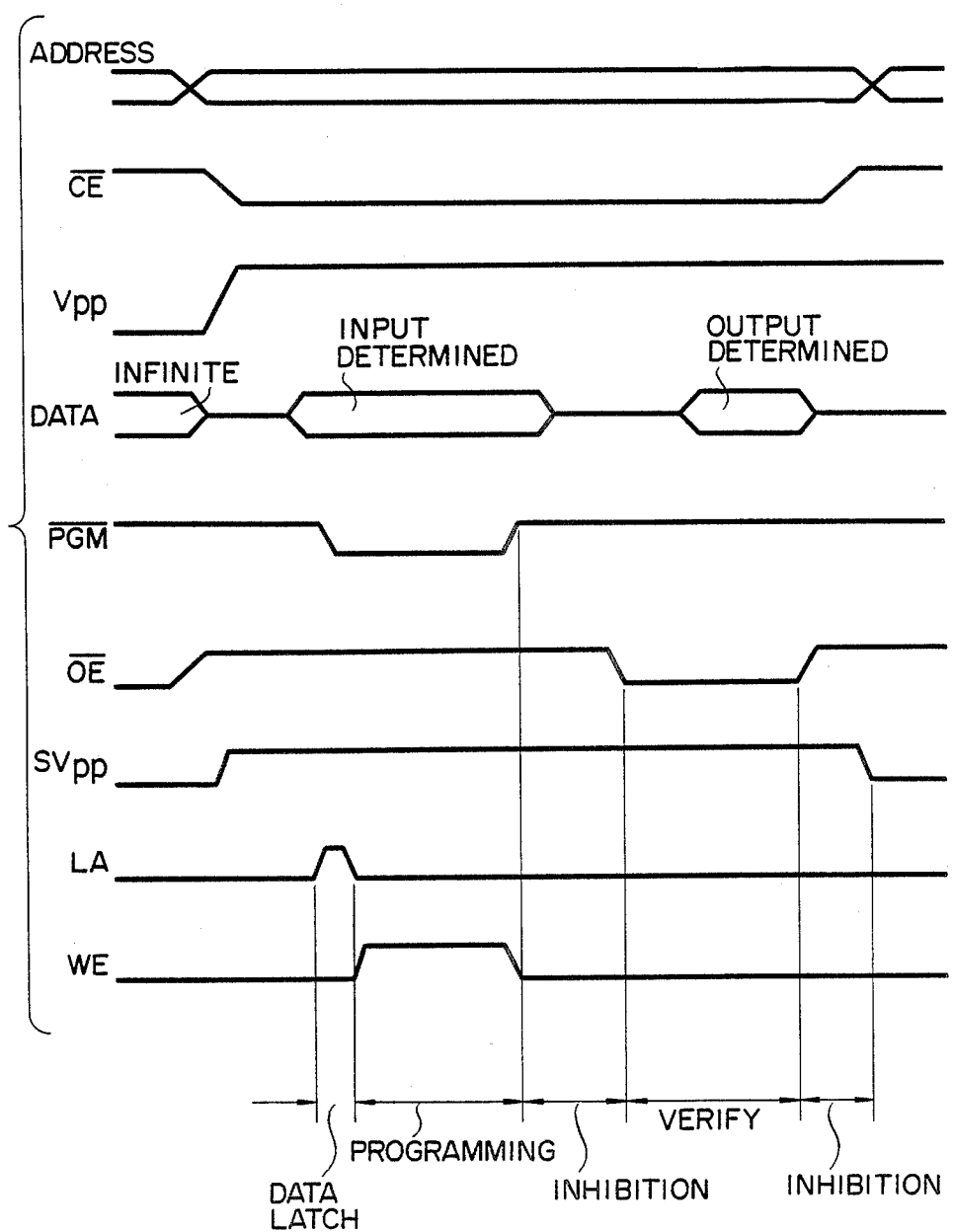
F I G. 7

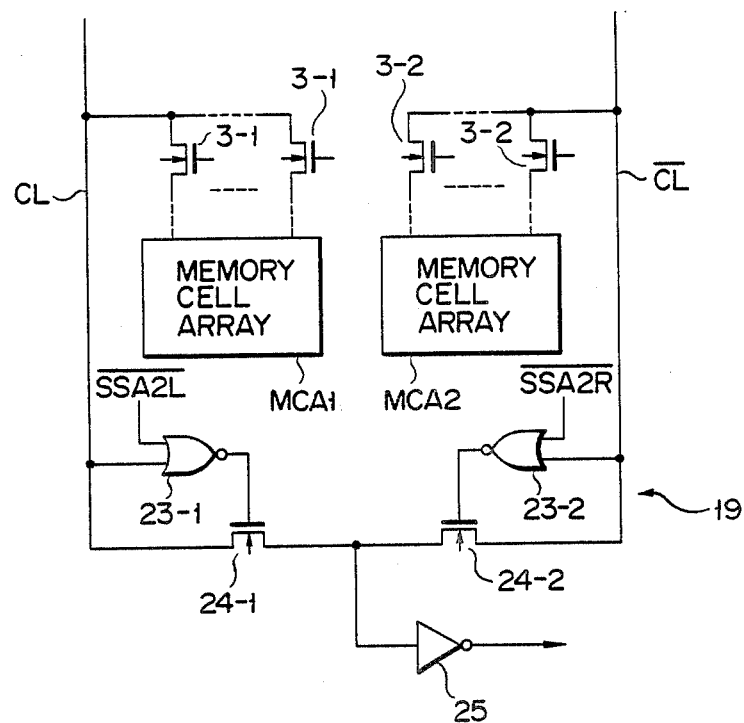
F I G. 10

2-CELL/1-BIT TYPE EPROM

BACKGROUND OF THE INVENTION

1. Field of the invention

This invention relates to a nonvolatile semiconductor memory device, and more particularly to a circuit for verifying newly programmed data, based on stored data, immediately after a data programming operation.

2. Description of the related art

Conventional ultraviolet erasable and programmable read only memories (EPROMs), make use of a 1-cell/1-bit system for data storage; that is, each memory cell formed of a floating gate type transistor is used to store one-bit data. With an increase in the operation speed of the central processing unit (CPU) used in recent computer systems, requirements for high speed for the EPROM have become stronger. In order to meet the requirement a 2-cell/1-bit type or 4-cell/1-bit type EPROM has been proposed. The above type EPROM is disclosed in, for example, IEEE JOURNAL OF SOLID-STATE CIRCUITS, VOL. SC-20. No.5, OCT., 1985, pp. 162, 163 and 332 "A 25-ns 16K CMOS PROM Using a FourTransistor Cell and Differential Design Technique" Saroj Pathak et. al. In the 2-cell/1-bit type EPROM, differential amplification type sense amplifier SA as shown in FIG. 1 is used. Sense lines SL and $\overline{SL}$, loads 31 and 32, bit line potential clamping transistors 33 and 34, common bit lines CL and $\overline{CL}$, column selection transistors 35 and 36, bit lines BL and $\overline{BL}$, and memory cells MC and $\overline{MC}$ are respectively arranged symmetrically with respect to sense amplifier SA. That is, load 31, the current path of clamping transistor 33, common bit line CL, the current path of column selection transistor 35, bit line BL and the current path of memory cell MC are series-connected between power sources Vcc and Vss. Further, a connection node between load 31 and clamping transistor 33 is connected to one end of sense line SL which is connected at the other end to a first input terminal of sense amplifier SA. Likewise, load 32, the current path of clamping transistor 34, common bit line $\overline{CL}$, the current path of column selection transistor 36, bit line $\overline{BL}$ and the current path of memory cell $\overline{MC}$ are series-connected between power sources Vcc and Vss. Further, a connection node between load 32 and clamping transistor 34 is connected to one end of sense line $\overline{SL}$ which is connected at &he other end to a second input terminal of sense amplifier SA. The gates of clamping transistors 33 and 34 are supplied with bias voltage VB. The gates of column selection transistors 35 and 36 are supplied with the same column selection signal. The control gates of memory cells MC and $\overline{MC}$ are supplied with the same word line selection signal The mutual conductances gm of loads 31 and 32 are set at the same value, and clamping transistors 33 and 34 and column selection transistors 35 and 36 are formed with the same size.

The programming operation of the EPROM is effected under the condition that a memory cell connected to one bit line is set in the programmed state (off condition) and a memory cell connected to the other bit line is set in the non-programmed state (on condition). One of the memory cells is selectively set into the programmed state (turned on) according to data to be programmed. As a result, complementary data are programmed into memory cells MC and $\overline{MC}$. In the data readout mode, whether stored data is "1" or "0" is determined according to the magnitude of the potentials read out from memory cells MC and $\overline{MC}$ and supplied to bit lines BL and $\overline{BL}$. In this case, the potentials of sense lines SL and $\overline{SL}$ are determined by the resistance ratio between the resistances of loads 31 and 32 and the resistances of memory cells MC and $\overline{MC}$. Complementary data are stored in memory cells MC and $\overline{MC}$, and mutual conductances gm thereof are different. Therefore, a potential difference occurs between sense lines SL and $\overline{SL}$ without fail. The potential difference is amplified by means of sense amplifier SA and then output as readout data.

As described above, according to the 2-cell/1-bit type EPROM, the potentials of sense lines SL and $\overline{SL}$ are set to different potential levels, high/low or low/high, so that the noise margin can be enlarged and the design suitable for high speed operation can be easily obtained.

In most cases, loads 31 and 32 of the circuit shown in FIG. 1 are each formed using P-channel enhancement type MOS transistor 41 having the gate and drain connected together as shown in FIG. 2. The relation between potentials of sense lines SL and $\overline{SL}$ obtained in this case and the potential of power source Vcc is shown in FIG. 3. FIG. 3 shows the relation between the potentials with shift amount $\Delta V_{TH}$ (which is a threshold voltage raised from the initial voltage by programming data to inject electrons into the floating gate electrode, and corresponds to the amount of programming charges) of the threshold voltage of memory cells MC and $\overline{MC}$ used as a parameter. The potential of the sense line (for example, SL) associated with memory cell MC set in the programmed state becomes higher than that of the sense line associated with memory cell $\overline{MC}$ set in the non-programmed state. A difference between the potentials (sense line potentials) becomes smaller as the potential of power source Vcc is raised, but the potential level relation thereof will not be reversed. Further, as shown in FIG. 4, the potential of the sense line associated with memory cell MC set in the programmed state becomes higher as the amount of programming charges $\Delta V_{TH}$ in the memory cell set in the programmed state is larger while the potential of power source Vcc is set at a constant level. Therefore, as the amount of programming charges $\Delta V_{TH}$ is larger, the difference between the sense line potentials becomes larger. In general, when the difference between the sense line potentials is supplied to sense amplifier SA, the amplification operation of sense amplifier SA is effected more stably and quickly as the difference between the sense line potentials is larger, thus improving the access time and noise margin.

In the conventional 1-cell/1-bit type EPROM, in order to attain a sufficiently large amount of charges programmed into the memory cell, it is common practice to set the voltage level (6.25 V, for example) of power source Vcc at the programming time relatively higher than that (5 V) of power source Vcc at the readout time. Further, the drain and control gate of a memory cell to be programmed are supplied with high level programming voltage Vpp (12.75 V). The verify operation is effected immediately after the programming operation, and the same voltage of power source Vcc as is used in the programming mode is used when it is checked whether or not the programming operation is satisfactorily effected. If it is detected that the programming operation is not effected satisfactorily, an additional programming operation is effected until a sufficiently large amount of programming charges is obtained. It is required to set a severe criterion for the programming charge amount in the verify operation in order to not only enlarge the noise margin but also enlarge the process margin including the reliability. The requirement is proposed in consideration of the possibility that the stored charges in the floating gate electrode of the EPROM will be lost after data is programmed, and the threshold voltage is lowered. The loss of programmed charges may be caused by the following two reasons: The first reason is that when data is programmed into a memory cell which is connected to the same bit line or word line of the memory cell array to which the memory cell having data stored in the preceding cycle is connected, an intense electric field is applied between the floating gate electrode and drain region or between the control gate electrode and floating gate electrode of the memory cell having data stored in the preceding cycle, thereby causing part of charges stored in the floating gate electrode of the data storing memory cell to be emitted along the electric field. The second reason is that the charge is lost when it is operated over a long period of time, for example, for several years.

However, unlike the 1-cell/1-bit type EPROM, in the 2-cell/1-bit type EPROM shown in FIG. 1, it is difficult to set the voltage level of power source Vcc to a high voltage level in order to ensure that data can be programmed with a sufficiently large amount of programming charges. This is because, when programming charge amount $\Delta V_{TH}$ of memory cell MC associated with one sense line (for example, SL) is small, 0 V, for example, in the 2-cell/1-bit type EPROM, the slightest amount of programming charges programmed into memory cell $\overline{MC}$ associated with the other sense line ($\overline{SL}$) may cause the potential of sense line $\overline{SL}$ to be set higher than that of sense line SL. The potential level relation between the potentials of the sense lines will not be reversed even when the voltage level of power source Vcc is raised. Therefore, even if the voltage level of power source Vcc is raised, it is impossible to ensure sufficiently large programming charge amount $\Delta V_{TH}$. When programming charge amount $\Delta V_{TH}$ becomes insufficient, the characteristics of access time $t_{ACC}$ and the noise margin will be degraded. Further, the loss of slight amount of programming charges may change data in the memory cell.

As described above, in the case of the EPROM using two sets of memory cells for each bit, it is impossible to ensure a sufficiently large amount of programming charges in the memory cell by simply setting the voltage level of power source Vcc higher in the programming mode than in the readout mode, thereby providing various problems.

SUMMARY OF THE INVENTION

Accordingly, an object of this invention is to provide a semiconductor memory device which can ensure a sufficiently large amount of programming charges even in the memory cell of the EPROM using two sets of memory cells for each bit, improve the characteristics of access time $t_{ACC}$ and the noise margin and enhance the operation reliability.

According to one aspect of this invention, there is provided a semiconductor memory device which comprises a first memory cell array having nonvolatile memory cells arranged in a matrix form; a second memory cell array having nonvolatile memory cells arranged in a matrix form and selected in combination with the respective memory cells of the first memory cell array in a paired form; a programming circuit for setting one of the paired memory cells selected from the first and second memory cell arrays into the programmed state and the other into the non-programmed state according to programming data and thus programming complementary data into the paired memory cells selected from the first and second memory cell arrays; a sense amplifier for determining stored data by comparing data read out from the selected memory cell in the first memory cell array with data read out from the selected memory cell in the second memory cell array; a latch circuit for temporarily storing input programming data when complementary data is programmed into a pair of selected memory cells of the first and second memory cell arrays; and a criterion setting circuit for setting a criterion severer in the verify operation effected immediately after complementary data has been programmed into the memory cells of the first and seoond memory cell arrays according to data latched in the latch circuit than in the normal readout operation.

With this construction, the criterion used for the verify operation can be severely set based on data input in the programming mode and therefore a sufficiently large amount of programming charges can be obtained in each memory cell.

Thus, there is provided a semiconductor memory device which can ensure a sufficiently large amount of programming charges even in the memory cell of an EPROM using two sets of memory cells for each bit, improve the characteristics of access time $t_{ACC}$ and the noise margin and enhance the operation reliability.

BRIEF DESCRIPTION OF THE DRAWINGS

FIG. 5 is a circuit diagram showing a programming/readout section of an EPROM according to a first embodiment of this invention;

FIG. 7 is a timing chart of various signals in the programming/verify mode in the EPROM of FIG. 5;

FIG. 10 is a circuit diagram showing another construction of a sense amplifier in the circuit of FIG. 9.

DETAILED DESCRIPTION OF THE PREFERRED EMBODIMENTS

Figure 1:
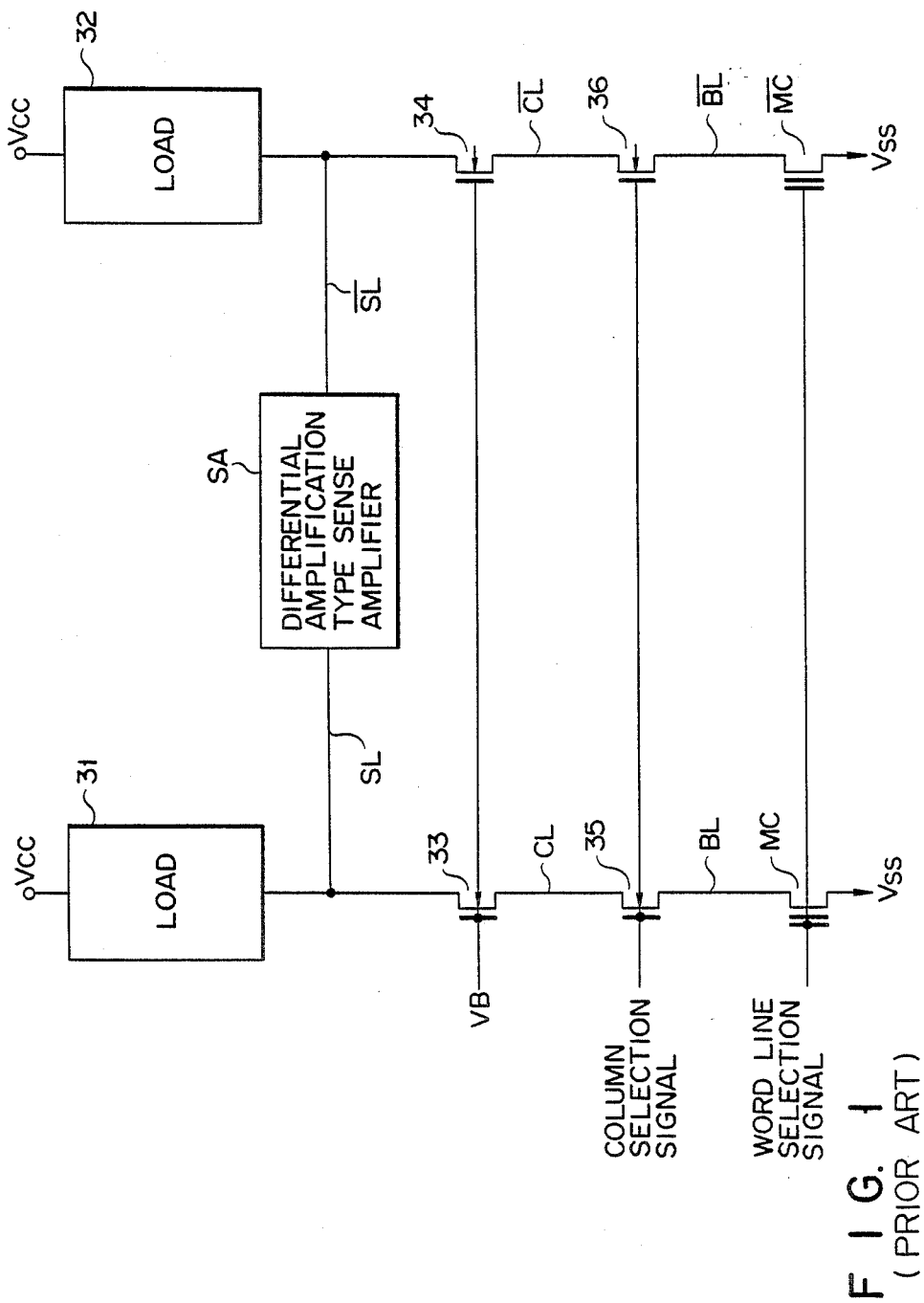
FIG. 1 is a circuit diagram showing a readout section of the conventional EPROM of 2-cell/1-bit type.
Figure 3:
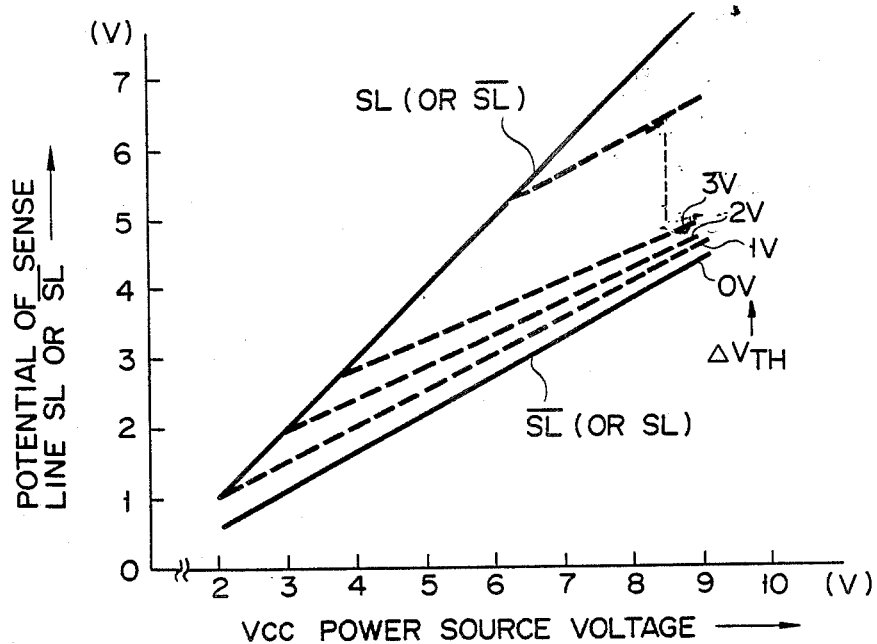
FIG. 3 is a characteristic diagram showing the relation between the power source voltage and the bit line potential in the programming mode of the EPROM shown in FIG. 1 with the amount of programming charges used as a parameter.
Figure 2:
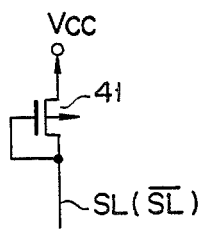
FIG. 2 is a circuit diagram showing the construction of a load used in the circuit of FIG. 1.
Figure 4:
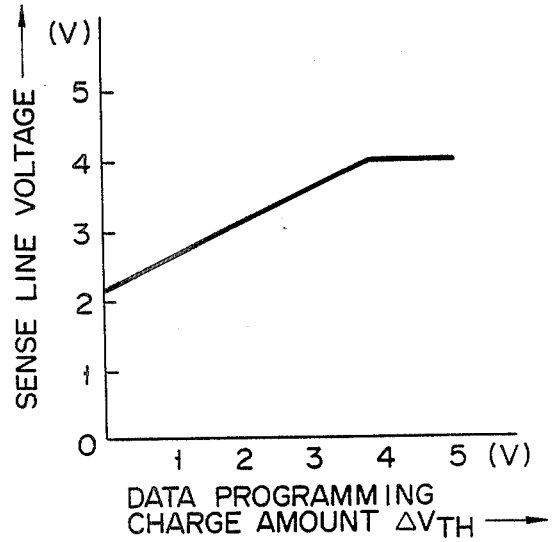
FIG. 4 is a characteristic diagram showing the relation between the amount of programming charges and the bit line potential in the readout mode with the power source voltage of the EPROM shown in FIG. 1 set at a constant voltage level.

FIG. 5 shows an example of a programming/readout section of a 2-cell/1-bit type EPROM. Sense line SL, the current path of potential clamping MOS transistor 2-1, common bit line CL, the curernt path of column selction transistor 3-1, bit line BL, and the current paths of a plurality of memory cell transistors MC are series connected between first input terminal N1 of differential amplification type sense amplifier 1 and power source terminal Vss. A plurality of series circuit sections each including the current path of column selection transistor 3-1, bit line BL and the current paths of a plurality of memory cell transistors MC are connected in parallel between common bit line CL and power source terminal Vss. A group of memory cells MC constitutes first memory cell array MCA1. The gate of clamping transistor 2-1 is applied with preset bias voltage VB. The current path of P-channel enhancement type MOS transistor 4-1 which acts as a load and whose gate and drain are connected together is connected between sense line SL and power source terminal Vcc. Further, the current path of programming N-channel enhancement type MOS transistor 5-1 is connected between bit line BL and power source terminal Vpp. Programming data Din is supplied to the gate of programming transistor 5-1 via inverter 6-1 which is operated on power source voltage Vpp. The current path of P-channel enhancement type MOS transistor 7-1 for pulling up the potential of sense line SL in the verify mode and the current path of load P-channel enhancement type MOS transistor 8-1 whose gate and drain are connected together are series-connected between sense line SL and power source terminal Vcc. The output terminal of NAND gate 9-1 is connected to the gate of pull-up transisto 7-1. The input terminals of NAND gate 9-1 are supplied with programming data Di from a data latching section to be described later and control signal PV which is set at "1" level in the programming mode and verify mode (set at "0" level in the readout mode).

Sense line SL̄, clamping transistor 2-2, common bit line C̄L̄, column selection transistor 3-2, bit line B̄L̄, a group of memory cells M̄C̄ (memory cell array MCA2), load transistor 4-2, programming transistor 5-2, inverter 6-2 operated on power source voltage Vpp, pull-up transistor 7-2, load transistor 8-2 and NAND gate 9-2 are connected to second input terminal N2 of sense amplifier 1 in the same connection manner as the corresponding portions with respect to first input terminal N1. In this case, the gate of inverter 6-2 operated on power source voltage Vpp is supplied with programming data Din after it has been inverted by means of inverter 10. One of the input terminals of NAND gate 9-2 is supplied with control signal PV, and the other input terminal is supplied with programming data Din after it has been inverted by means of inverter 11. Each of memory cells MC and M̄C̄ in memory cell arrays MCA1 and MCA2 is selected by a word line selection signal supplied via word line WL and a column selection signal, and one of memory cells MC in memory cell array MCA1 and one of memory cells M̄C̄ in memory cell array MCA2 designated by a corresponding address are selected at the same time. In other words, two memory cells MC and M̄C̄ connected to paired bit lines BL and B̄L̄ and to the same word line WL are allotted for one bit.

Load transistors 4-1 and 4-2 are formed with the same size and capacitance, load transistors 8-1 and 8-2 are formed with the same size and capacitance, and pullup transistors 7-1 and 7-2 are formed with the same size and capacitance.

One end of the current path of first transfer gate N-channel enhancement type MOS transistor 12 is supplied with programming data Din from the exterior of the EPROM. The other end of the current path of transistor 12 is connected to the input terminal of latch circuit 13. The output terminal of latch circuit 13 is connected to one end of the current path of second transfer gate N-channel enhancement type MOS transistor 14. The other end of the current path of transistor 14 is connected to the input terminals of NAND gate 9-1 and inverter 11. The gate of transistor 12 is supplied with latch pulse LA, and the gate of transistor 14 is supplied with control signal SVpp. In this case, signals LA and SVpp are formed based on a different control signal in the chip and generated at the timings as will be described later. Externally supplied programming data Din is supplied as internal programming data Di to the input terminals of NAND gate 9-1 and inverter 11 via transistor 12, latch circuit 13 and transistor 14.

Figure 6:
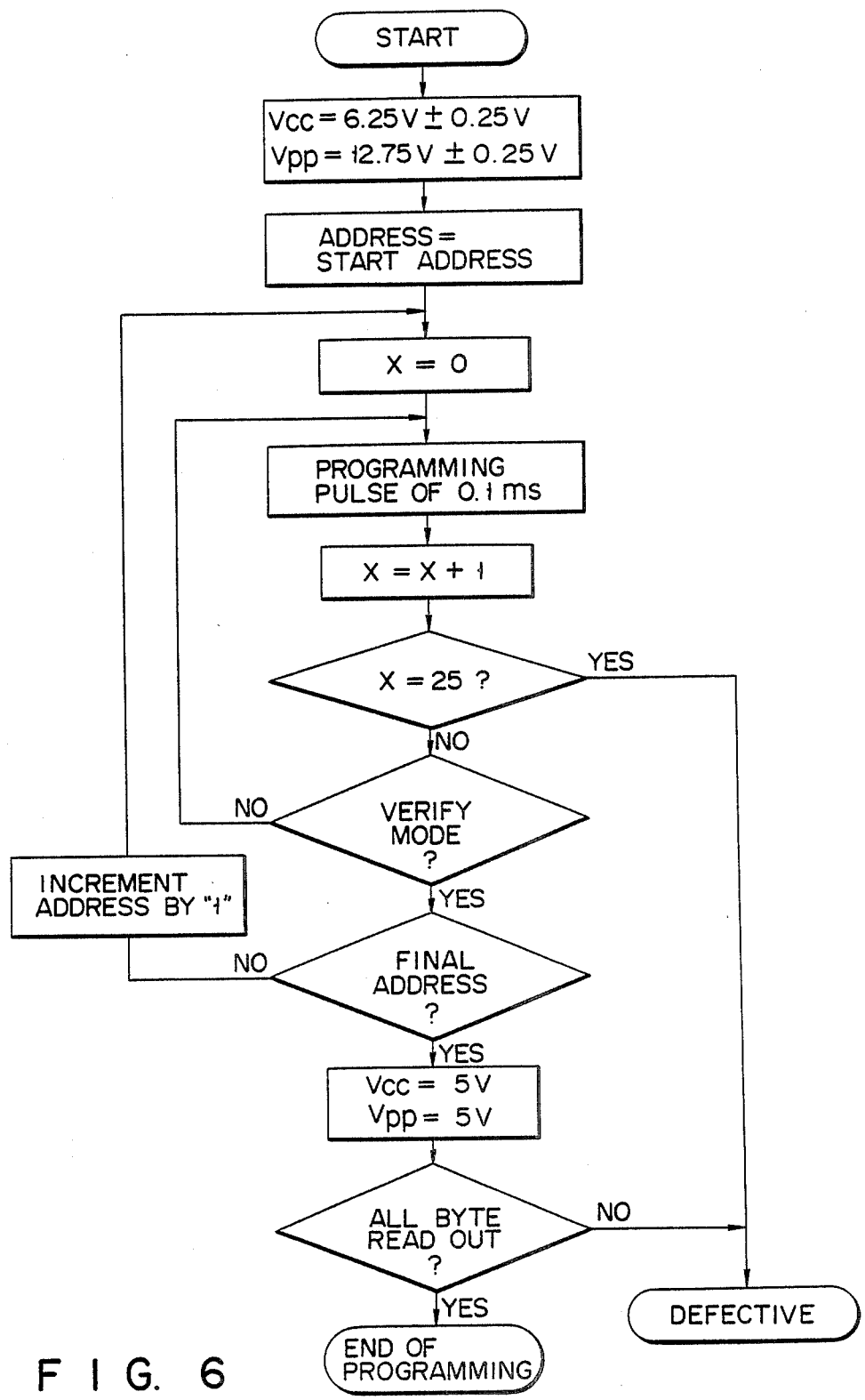
FIG. 6 is a flowchart showing the data programming process in the EPROM of FIG. 5.

The programming/verify process in the EPROM of FIG. 5 is shown by the flowchart of FIG. 6. FIG. 7 shows the timing relation between an address input, chip enable signal C̄Ē input, programming voltage Vpp input, programming control signal P̄ḠM̄ input, output enable signal ŌĒ input, input data, output data, internal control signal SVpp, latch pulse LA, and programming enable signal WE in the programming/verify operation of the EPROM. On the other hand, in the programming mode, power source voltage Vpp is applied. Chip enable signal C̄Ē becomes active after the address signal is changed, and programming control signal P̄ḠM̄ becomes active after the input data is determined. At this time, voltage Vpp (for example, 12.75 V) is applied to power source terminal Vpp of FIG. 5, and a voltage of 6.25 V, for example, which is higher than ordinary readout voltage 5 V is applied to power source terminal Vcc. There will now be described the programming-/verify operation in the case where programming data Din is set at "0" level, for example.

In the case where programming data Din is "0", voltage Vpp is applied to the gate of programming transistor 5-1 via inverter 6-1 to turn on transistor 5-1, and a ground potential is applied to the gate of programming transistor 5-2 to turn off the transistor. At this time, the potential of bit line BL connected to column selection transistor 3-1 selected by the output (column selection signal) of the column decoder (not shown) is set to voltage level Vpp, and that one of memory cells MC connected to selected bit line BL which is supplied at the gate with voltage Vpp from selected word line WL is set into the programmed state ("0" state). On the other hand, memory cell M̄C̄ connected to the other bit line B̄L̄ is set into the non-programmed state ("1" state).

Next, in the verify operation, pull-up transistor 7-1 connected to sense line SL associated with the programmed memory cell is set in the off-state since output "1" of NAND gate 9-1 supplied with data Di of "0" level latched in the programming mode as will be described later is supplied to the gate thereof. Load transistor 4-1 is used as a load of sense line SL as in the case of the ordinary readout mode. In contrast, pull-up transistor 7-2 connected to sense line S̄L̄ associated with the non-programmed memory cell is set in the on-state since output "0" of NAND gate 9-2 supplied with control signal PV of "1" level and programming data of "1" level is supplied to the gate thereof. Therefore, the load of sense line S̄L̄ becomes larger that in the ordinary readout mode, and the potential of sense line S̄L̄ is set at a higher level than in the ordinary readout mode. That is, the potential of sense line $\overline{SL}$ associated with the non-programmed memory cell is pulled up to reduce the potential difference between sense lines SL and $\overline{SL}$ which is caused by the difference in mutual conductance gm between programmed memory cell MC and non-programmed memory cell $\overline{MC}$.

In this way, the criterion for the level comparison of the potential of data "0" read out from memory cell MC associated with sense line SL becomes severe, and if programming charge amount $\Delta V_{TH}$ in memory cell MC is insufficient, the requirement of the verify check cannot be met. In such a case, data is re-programmed according to the algorithm shown in FIG. 6, for example, and as a result, sufficiently large programming charge amount $\Delta V_{TH}$ will be obtained.

In contrast, when programming data Din is "1", memory cell $\overline{MC}$ selected in memory cell array MCA2 is set into the programmed state ("0" state) and memory cell MC selected in memory cell array MCA1 is set into the non programmed state ("1" state). The operation after this is effected in substantially the same manner as that in the case where programming data Din is "0".

In the above verify mode, the readout data from each memory cell is determined to be "1" or "0" by sense amplifier 1, and output data is supplied from the input-/output terminal in response to output enable signal $\overline{OE}$ after the output data is determined. Therefore, it is impossible to determine whether the content of immediately preceding programmed data Din is "1" or "0" according to the output data. For this reason, the content of immediately preceding programmed data Din is stored in the verify mode, and the potential of sense line SL or $\overline{SL}$ which lies on the non-programmed memory cell side is controlled to be pulled up according to the stored data. In order to store programming data Din in the data programming mode, transistor 12, latch circuit 13 and transistor 14 are provided. When the programming mode is set in response to externally supplied voltage Vpp, control signal SVpp becomes active to turn on transistor 14. After the programming mode is set, for example, after 100 ns, latch pulse LA becomes active to turn on transistor 12, causing programming data Din to be latched in latch circuit 13. In the period of the latching operation, the internal circuit is not set into the programming mode, that is, write enable signal WE is kept non-active in order to prevent the erroneous data programming operation from being effected in response to the change of the latch data. After data input Din has been latched and become stable, latch pulse LA becomes non-active to turn off transistor 12. Then, the programming mode is set and the programming operation is effected as described before. After a predetermined inhibition period of time, the verify mode is set and the verify operation is effected. During this period of time, transistor 12 is kept nonconductive, and the same data latching operation as described before is effected when the next programming mode is set. In the ordinary readout mode, latch pulse LA is not generated so that transistor 12 will be kept nonconductive and the above data latching operation will not be effected.

Figure 8:
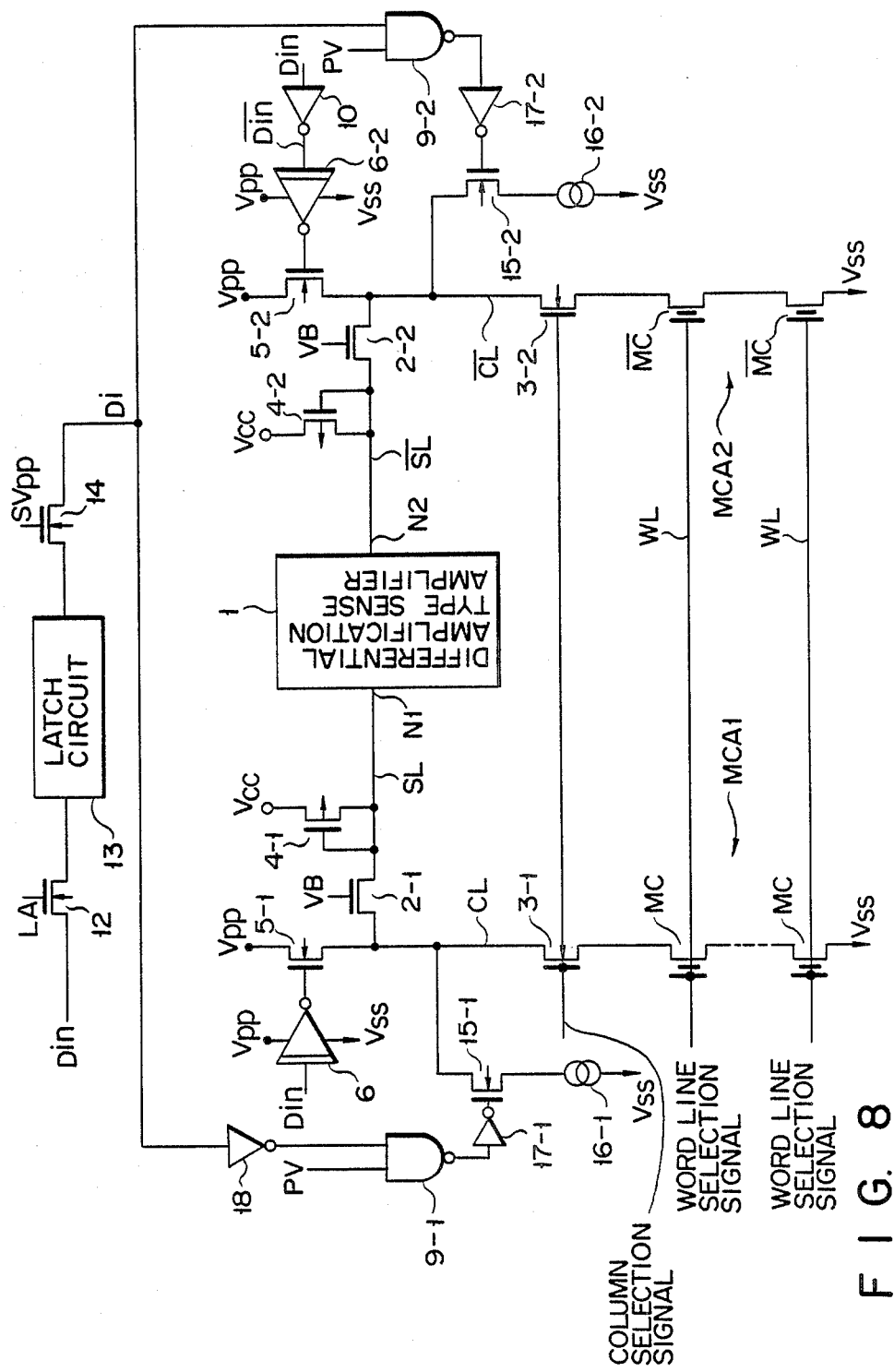
FIG. 8 is a circuit diagram showing a programming/readout section of an EPROM according to a second embodiment of this invention.

FIG. 8 shows a second embodiment of this invention in which a leak current path is added to the sense line associated with the memory cell into which data is programmed in the verify mode according to the data latched in the programming mode. The potential of sense line SL or $\overline{SL}$ is lowered via the leak current path to reduce the potential difference between the sense lines associated with the programmed and nonprogrammed memory cells, thus setting a severe criterion for data determination. Portions of FIG. 8 which are the same as those in FIG. 5 are denoted by the same reference numerals, and the detail explanation therefor is omitted. In FIG. 8, bit lines BL and $\overline{BL}$ of respective memory cell arrays MCA1 and MCA2 are typically shown. One end of the current path of enhancement type N-channel switching MOS transistor 15-1 is connected to common bit line CL. Leak current source 16-1 is connected between the other end of the current path of transistor 15-1 and power source Vss. The output terminal of inverter 17-1 is connected to the gate of transistor 15-1, and the input terminal of inverter 17-1 is connected to the output terminal of NAND gate 9-1. One input terminal of NAND gate 9-1 is supplied with control signal PV, and the other input terminal thereof is connected to the output terminal of inverter 18. The input terminal of inverter 18 is connected to the other end of the current path of transistor 14. Likewise, one end of the current path of enhancement type N-channel switching MOS transistor 15-2 is connected to common bit line $\overline{CL}$. Leak current source 16-2 is connected between the other end of the current path of transistor 15-2 and power source Vss. The output terminal of inverter 17-2 is connected to the gate of transistor 15-2, and the input terminal of inverter 17-2 is connected to the output terminal of NAND gate 9-2. One input terminal of NAND gate 9-2 is supplied with control signal PV, and the other input terminal thereof is connected to the other end of the current path of transistor 14.

First, the programming/verify operation in the case where programming data Din is "0" is explained. In the case where programming data Din is "0", that one of memory cells MC connected to bit line BL which is supplied with voltage Vpp from selected word line WL is set into the programmed state ("0" state) in the same manner as in the case of the circuit shown in FIG. 5, and memory cell $\overline{MC}$ connected to the other bit line BL is set into the non-programmed state ("1" state).

In the verify operation, the gate of switching transistor 15-2 connected to sense line $\overline{SL}$ on the nonprogrammed side is supplied with an output of inverter 17-2 which has inverted output "1" of NAND gate 9-2 receiving programming data Din of "0" level latched in the programming operation, and transistor 15-2 is turned off. In contrast, the gate of switching transistor 15-1 connected to sense line SL on the programmed side is supplied with an output of inverter 17-1 which has inverted output "0" of NAND gate 9-1 receiving control signal PV of "1" level and programming data Din of "1" level, and transistor 15-1 is turned on. As a result, sense line SL is discharged via transistor 15-1 and leak current source 16-1, and the potential thereof becomes lower than in the normal readout operation. That is, the potential of sense line SL on the programmed side is pulled down to reduce the potential difference between sense lines SL and $\overline{SL}$ caused by the difference between mutual conductances gm of programmed memory cell MC and non-programmed memory cell $\overline{MC}$.

In this way, the criterion used for level comparison with respect to the potential of data "0" read out from memory cell MC to sense line SL becomes severe and consequently a sufficiently large programming charge amount $\Delta V_{TH}$ can be attained.

In a case where programming data Din is "1", a selected one of memory cells $\overline{MC}$ in memory cell array MCA2 is set into the programmed state ("0" state) and a selected one of memory cells MC in memory cell array MCA1 is set into the non-programmed state ("1" state). The succeeding operation is effected in the same manner as in the case of programming data Din of "0" level.

Figure 9:
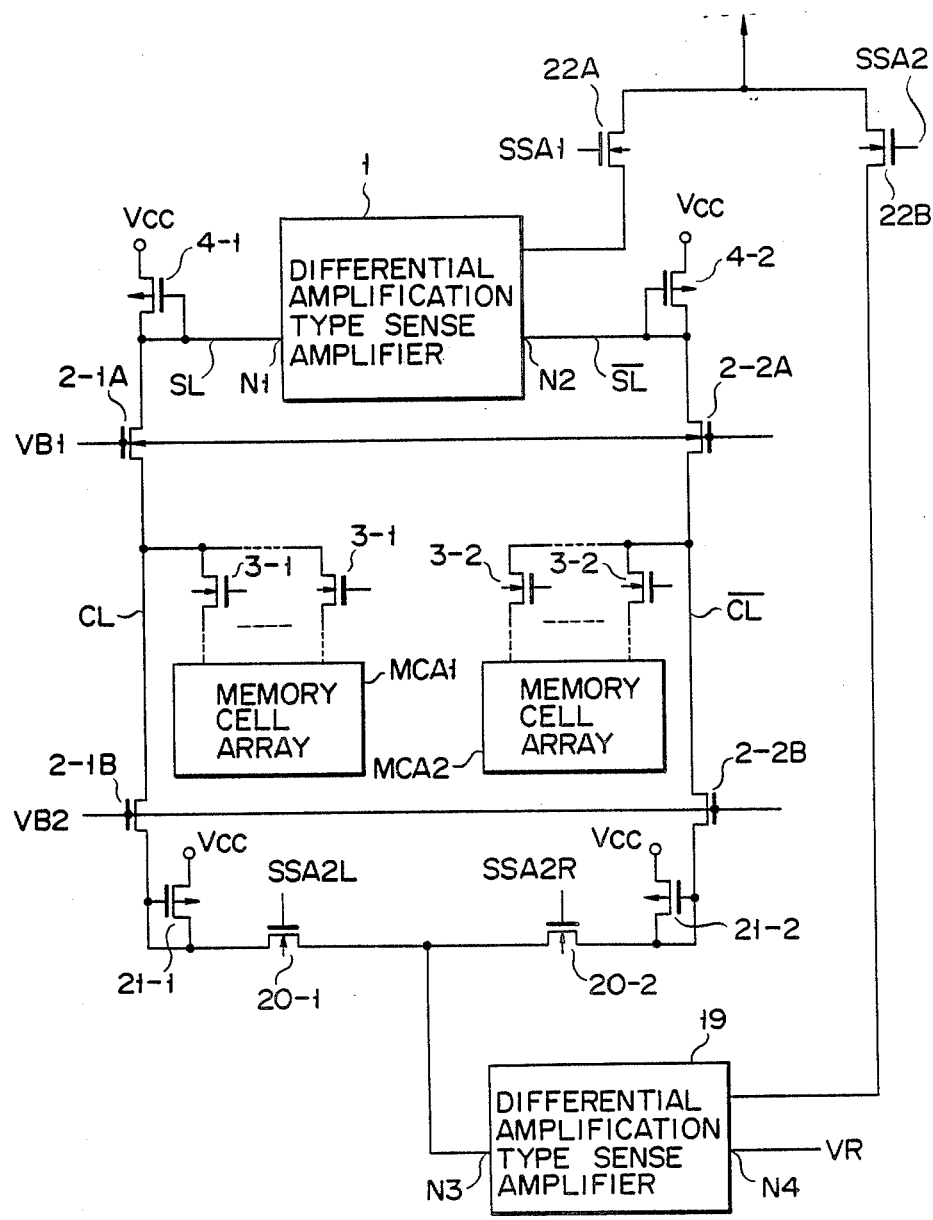
FIG. 9 is a circuit diagram showing a programming/readout section of an EPROM according to a third embodiment of this invention.

FIG. 9 shows a semiconductor memory device according to a third embodiment of this invention. In the EPROM of this embodiment, two sense amplifiers are used. That is, differential amplification type sense amplifier 1 is used for the normal data readout operation and differential amplification type sense amplifier 19 is used for the data readout operation in the verify mode. In this circuit, a circuit section for programming data Din and a latching circuit section are omitted. The circuit sections are basically the same as those shown in FIG. 5 or 8. One end of each of common bit lines CL and $\overline{CL}$ is connected to one end of a corresponding one of the current paths of potential clamping MOS transistors 2-1A and 2-2A. The gates of transistors 2-1A and 2-2A are applied with bias voltage VB1. The other ends of the current paths of transistors 2-1A and 2-2A are respectively connected to first and second input terminals N1 and N2 of differential amplification type sense amplifier 1 via sense lines SL and $\overline{SL}$. The current path of enhancement type P-channel MOS transistor 4-1 whose gate and drain are connected together and which acts as a load is connected between sense line SL and power source Vcc. The current path of enhancement type P-channel MOS transistor 4-2 whose gate and drain are connected together and which acts as a load is connected between sense line $\overline{SL}$ and power source Vcc. The other end of each of common bit lines CL and $\overline{CL}$ is connected to one end of the current path of a corresponding one of potential clamping MOS transistors 2-1B and 2-2B. The gates of transistors 2-1B and 2-2B are applied with bias voltage VB2. The other end of the current paths of each of transistors 2-1B and 2-2B is connected to one end of the current path of a corresponding one of enhancement type N-channel MOS transistors 20-1 and 20-2 for determining whether memory cell array MCA1 or MCA2 is selected The gate of transistor 20-1 is supplied with signal SSA2L which is set at a high or low level respectively when memory cell array MCA1 or MCA2 is selected The gate of transistor 20-2 is supplied with signal SSA2R which is set at a high or low level respectively when memory cell array MCA2 or MCA1 is selected Signals SSA2L and SSA2R are generated according to a latch signal of programming data Din. For example, signal Di in the circuit shown in FIG. 5 or 8 is supplied as signal SSA2L to the gate of transistor 20-2, and inverted signal $\overline{Di}$ of signal Di is supplied as signal SSA2R to the gate of transistor 20-2. The other ends of the current paths of transistors 20-1 and 20-2 are connected together. The current path of enhancement type P-channel MOS transistor 21-1 whose gate and drain are connected together and which acts as a load is connected between one end of the current path of transistor 20-1 and power source Vcc. The current path of enhancement type P-channe MOS transistor 21-2 whose gate and drain are connected together and which acts as a load is onnected etween one end of the current path of transistor 20-2 and power source Vc. A common conection node between the other ends of transistors 20-1 and 20-2 is connected to first input terminal N3 of diffrnetial amploification type sense amplifier 19. Second input terminal N4 of sense amplifier 19 is applied with reference voltage VR. The output terminals of sense amplifier 1 and 19 are respectively connected to one-end of the current paths of enhancement type N-channel MOS transistors 22A and 22B. The gate of trnsistor 22A is supplied with signal SSA1 which is set at a high or low level respectively in the normal readout mode or in the programming and verify modes, and the gate of transistro 22B is supplied withsignal SSA2 which is set at a high or low level respectively in the programming and verify modes or in the normal readout mode. The other ends of the current paths of transistors 22A and 22B are connected togehter, and readout data in the normal readout mode or data in the verify mode is read out from a connection node of the other ends of the current paths.

With the above construction, bias voltage VB1 is applied to transistros 2-1A and 2-2A and signal SSA1 is set at a high level in the data readout mode, so that transistors 2-1A, 2-2A and 22A are turned on. At this time, application of bias voltage VB2 to transistors 2-1B and 2-2B is interrupted, and signal SSA2 is set at a low level, so that transistors 2-1B, 2-2B and 22B are turned off. In this case, complementary data read out from one of memory cells MC selected from memory cell array MCA1 and one of memory cells $\overline{MC}$ selected from memory cell array MCA2 is amplified by means of sense amplifier 1, and output via transistor 22A. In the data programming mode, the same programming circuit as inverters 6-1 and 6-2 and transistors 5-1 and 5-2 in the circuit of FIG. 5 or 8 is used to program data into one of memory cells MC selected in memory cell array MCA1 or one of memory cells $\overline{MC}$ selected in memory cell array MCA2. Further, in the verify mode, bias voltage VB2 is applied to transistors 2-1B and 2-2B and signal SSA2 is set at a high level, so that transistors 2-1B, 2-2B and 22B are turned on. At this time, application of bias voltage VBl to transistors 2-1A and 2-2A is interrupted, and signal SSA1 is set at a low level, so that transistors 2-1A, 2-2A and 22A are turned off. In this case, if programming data Din is "0", signal SSA2L is set at a high level and signal SSA2R is set at a low level, thereby causing data to be read out from a programmed one of memory cells MC in memory cell array MCA1 and supplied to first input terminal N3 of sense amplifier 19 via the bit line, transistor 3-1, common bit line CL, transistor 2-1B and transistor 20-I. Reference voltage VR is applied to second input terminal N4 of sense amplifier 19. The potential difference between the level of data of a programmed one of memory cells MC in memory cell array MCA1 and reference voltage VR is amplified by means of sense amplifier 19 and output via transistor 22B. Reference voltage VR is higher than the potential of sense line $\overline{SL}$ on the nonprogrammed side in the normal readout mode and lower than the potential of sense line SL on the programmed side in the normal readout mode. Thus, the criterion used for the level determination for the potential of data "0" read out from memory cell MC becomes severer. Therefore, if programming charge amount $\Delta V_{TH}$ for memory cell MC is insufficient, the requirement of the verify check cannot be met. In such a case, data is reprogrammed according to the algorithm shown in FIG. 6, for example, and as a result, sufficiently large programming charge amount $\Delta V_{TH}$ for selected memory cell MC will be obtained.

In contrast, when programming data Din is "1", memory cell $\overline{MC}$ selected in memory cell array MCA2 is set into the programmed state ("0" state) and memory cell MC selected in memory cell array MCA2 is set into the non-programmed state ("1" state). In the verify mode, signal SSA2R is set at a high level and signal SSA2L is set at a low level, thereby causing data to be read out from a programmed one of memory cells $\overline{MC}$ in memory cell array MCA2 and supplied to first input terminal N3 of sense amplifier 19 via the bit line, transistor 3-2, common bit line $\overline{CL}$, transistor 2-2B and transistor 20-2. Then, the same operation as that in the verify mode for data "0" is effected.

FIG. 10 shows another construction of sense amplifier 19 in the circuit of FIG. 9. In the circuit of FIG. 9, the differential amplification type sense amplifier is used. However, in the circuit of FIG. 10, a feedback type sense amplifier is used. That is, in this example, sense amplifier 19 includes feedback type 2-input NOR gates 23-1 and 23-2, enhancement type N-channel MOS transistors 24-1 and 24-2, and inverter 25. One input terminal of NOR gate 23-1 is connected to common bit line CL, the other input terminal thereof is supplied with inverted signal $\overline{SSA2L}$ of signal SSA2L, and the output terminal thereof is connected to the gate of transistor 24-1. One end of the current path of transistor 24-1 is connected to common bit line CL. One input terminal of NOR gate 23-2 is connected to common bit line $\overline{CL}$, the other input terminal thereof is supplied with inverted signal $\overline{SSA2R}$, and the output terminal thereof is connected to the gate of transistor 24-2. One end of the current path of transistor 24-2 is connected to common bit line $\overline{CL}$, and the other end thereof is connected to the other end of the current path of transistor 24-1. A connection node between the other ends of the current paths of transistors 24-1 and 24-2 is connected to the input terminal of inverter 25. Data is read out from the output terminal of inverter 25 in the verify mode.

With feedback type sense amplifier 19, it is not necessary to supply reference voltage VR which is used in the case of the differential amplification type sense amplifier. In the case of feedback type sense amplifier 19, the circuit threshold voltage of inverter 25 is used for level determination of the potential of common bit line CL or $\overline{CL}$.

In each of the above embodiments, each memory cell is formed of one transistor, but this invention can be applied to the case where each memory cell is formed of a plurality of transistors.

Further, in the above embodiment, a 2-cell/1-bit type EPROM is used, but this invention can be applied to the 4-cell/1-bit type EPROM which is disclosed in IEEE JOURNAL OF SOLID-STATE CIRCUITS as described in "Related Art".

That is, this invention can be generally applied to a semiconductor memory device in which two sets of programmable nonvolatile memory cells selected by the same word line selection signal and the same column selection signal are used for each bit and a difference between the potentials of the paired bits respectively connected to the two sets of memory cells is amplified by means of a sense amplifier for determining the readout data.

As described above, according to this invention, there is provided a semiconductor memory device in which a sufficiently large amount of programming charge can be obtained in each memory cell so that the characteristics of access time $t_{ACC}$ and the noise margin can be improved and the operation reliability can be enhanced.

What is claimed is:

1. A semiconductor memory device comprising:
a first memory cell array having nonvolatile memory cells arranged in a matrix form:
a second memory cell array having nonvolatile memory cells arranged in a matrix form and selected in combination with the respective memory cells of said first memory cell array in a paired form;
data write means for settng, in accordance with programming data, one of the paired memory cells selected from said frist and second memory cell arrays into a write state and the other one of the paried memory cells into a non-write state, thereby programming complementary data into the paired memory cells selected from said first and second memory cell arrays;
sense amplifier means for determinnig stored data by comparing data read out from the selected memory cell in said first memory cell array with data read out from the selected memory cell in said second memory cell array;
latch means for latching the programming data in order to write the programming data into the pair of selected memory cells of said first and second memory cell arrays; and
criterion setting means for setting a program vertification criterion for use during a program vertification operation, performed immediately after the complementary data has been written into the pair of selected memory cells, for verifying in accordance with the verification criterion that the programming data has been programmed into the pair of selected memory cells, the vertification criterion being set in accordance with the programming data latched by the latch means and being more severe than a criterion in accordance with which the sense amplifier means determines stored data in a read out operation.

2. A semiconductor memory device according to claim 1, wherein said criterion setting means includes potential difference reducing menas for setting the potential difference between the potentials of data read out from selected ones of the memory cells in said first and second memory cell arrays smaller in the program verification operation effected immediately after complementary data has been programmed into the memory cells of said first and second memory cell arrays than in the readout operation.

3. A semiconductor memory device according to claim 1, wherein said criterion setting means includes means for increasing a load conductance of a first input terminal of said sense amplifier means during the program verification operation, said sense amplifier means being connected to the one of siad first and second memory cell arrays which includes the memory cell set in the non-write state when the programming data is written into the pair of selected memory cells.

4. A semiconductor memory device according to claim 3, wherein said means for increasing the load conductance includes first and second load means respectively connected to the first and a second input terminal of said sense amplifier means; and third and fourth load means respectively connected to the first and second input terminals of said sense amplifier means; one of siad third and fourth load means being set into the non-operative state while the other is set in the operative state according to an output of said latch means.

5. A semiconductor memory device according to claim 4, wherein each of said first and second load means includes an enhancement type P-channel MOS transistor whose gate and drain are connected together.

6. A semiconductor memory device according to claim 4, wherein said third load means includes a first MOS transistor of P-channel enhancement type whose gate and drain are commonly connected to the first input terminal of said sense amplifier means; and a second MOS transistor of P-channel enhancement type whose current path is connected between the source of said first MOS transistor and a first potential supplying source and whose conduction state is controlled by the output of said latch means, and said fourth load means includes a third MOS transistor of P-channel enhancement type whose gate and drain are commonly connected to the second input terminal of said sense amplifier means; and a fourth MOS transistor of P-channel enhancement type whose current path is connected between the source of said third MOS transistor and said first potential supplying source and whose conduction state is controlled by an inverted signal of the output of said latch means.

7. A semiconductor memory device according to claim 1, wherien said criterion setting means includes means for increasing a leak current of a first input terminal of said sense amplifier means during the verification operation, said sense amplifier means being connected to the one of said first and second memory cell arrays which includes the memory cell set in the non-write state when the programming data is written into the selected pair of memeory cells.

8. A semiconductor memory device according to claim 7, wherein said leak means includes first switching means which is connected at one end to the first input terminal of said sense amplifier means and whose switching position is controlled based on an inverted signal of the output of said latch means; a first leak current source connected between the other end of said first switching means and a second potential supplying source; second switching means which is connected at one end to a second input terminal of said sense amplifier means and whose switching position is controlled based on the output of said latch means; and a second leak current source connected between the other end of said second switching means and said second potential supplying source.

9. A semiconductor memory device according to claim 8, wherein each of said first and second switching means includes a MOS transistor.

10. A semiconductor memory device according to claim 1, wherein said criterion setting means includes:
a program verification sense amplifier having first and second input terminals, the first input terminal being supplied with an electric potential corresponding to data read out from the memory cell set in the write state when the programming data is written into the selected pair of memory cells, and the second input terminal being supplied with a reference potential; and
selecting means for selecting an output signal output from the sense amplifier means, during the readout operation, and for selecting an output signal output from the program verification sense amplifier during the program verification operation.

11. A semiconductor memory device according to claim 10, wherein said program verification sense amplifier includes a differential amplification type sense amplifier.

12. A semiconductor memory device according to claim 11, wherein the refernece potential applied to teh second input terminal of said program verification sense amplifier is set higher than the potential of data read out from the meory cell set in the non-write state, in the readout operation and lower than the potential of data read out from the memeory cell set in the write state.

13. A semiconductor memory device according to claim 10, wherein said program verification sense amplifier includes a feedback type sense amplifier.

14. A semiconductor memory device according to claim 1, wherein said data write means includes a first MOS transistor whose current path is connected at one end to a programming power source terminal and at the other end to said first memory cell array; first level shifter means for shifting the potential of programmed data to the potential level of the programming voltage and applying the potential to the gate of said first MOS transistor; a second MOS transistor whose current path is connected at one end to said programming power source terminal and at the other end to said second memory cell array; and second level shifter measn for shifting the potential of an inverted signal of programmed data to the potential level of the programming voltage and applying the potential to the gate of said second MOS transistor.

15. A semiconductor memory device according to claim 14, wherein said each of said first and second level shifter means includes an inverter operated on the programming voltage.

16. A semiconductor memory device according to claim 1, wherein said latch means includes a first MOS transistor whose current path receives the programming data at one end and whose gate is supplied with a latch pulse kept at a high level for a preset period of time prior to the data programming operation; a latch circuit whose input terminal is connected to the other end of a current path of said first MOS transistor; a second MOS transistor whose current path is connected at one end to the output terminal of said latch circuit and whose gate is suppoleid with a first control signal set at a high elvel during data programming and program verification operations; ad first NAND gate whose first input terminal is connected to the other end of the current path of said second MOS transistor and whose second input terminal is supplied with a second control signal set at a high level during programming and program verification operations and at a low level during the readout operation; and a second NAND gate whose first input terminal is connected to the other end of the current path of said second MOS transistor and whose second input terminal is supplied with an inverted signal of the second control signal.

17. A semiconductor memory device according to claim 1, wherein said sense amplifier means includes a differential amplification type sense amplifier.

* * * * *